United States Patent [19]
Dent et al.

[11] Patent Number: 5,230,003
[45] Date of Patent: Jul. 20, 1993

[54] DECODING SYSTEM FOR DISTINGUISHING DIFFERENT TYPES OF CONVOLUTIONALLY-ENCODED SIGNALS

[75] Inventors: Paul W. Dent, Stehags; Alex K. Raith, Kista, both of Sweden

[73] Assignee: Ericsson-GE Mobile Communications Holding, Inc., Paramus, N.J.

[21] Appl. No.: 652,544

[22] Filed: Feb. 8, 1991

[51] Int. Cl.$^5$ ............................................. G06F 11/10
[52] U.S. Cl. ..................................... 371/43; 371/391
[58] Field of Search ................ 371/43, 44, 45, 49.1, 371/25.1, 38.1, 39.1, 25.1

[56] References Cited

U.S. PATENT DOCUMENTS

5,014,275 5/1991 Shimada et al. ................. 371/43
5,014,276 5/1991 Bush et al. ........................ 371/43

*Primary Examiner*—Robert W. Beausoliel, Jr.
*Assistant Examiner*—Phung My Chung
*Attorney, Agent, or Firm*—Burns, Doane, Swecker & Mathis

[57] ABSTRACT

A decoding system discriminates between different types of communications traffic signals. Each type of traffic signal is encoded using a different error correction code. Plural, parallel decoders each decode a received traffic signal using a different decoding technique. Each decoding technique operates in accordance with one of the error correction codes. A quantitative measurement of the reliability of a decoded result is generated by each decoder. A comparison processor accumulates the quantitative measurements made by each decoder and compares the accumulated values. That decoder having the most reliable, accumulated value is selected to decode the current traffic signals. The remaining decoders are deactivated to conserve processing time.

24 Claims, 5 Drawing Sheets

DECODING SYSTEM FOR DISTINGUISHING DIFFERENT TYPES OF CONVOLUTIONALLY-ENCODED SIGNALS

FIELD OF THE INVENTION

The present invention relates to a decoding system for use in signal communications, and in particular, to a decoding system that distinguishes between different types of convolutionally-encoded signals.

BACKGROUND OF THE INVENTION

In modern communications systems, the information included in an error correction coded digital signal may be a digitized voice signal at one point in time and a digital data signal such as computer data, signalling information, digitized facsimile or the like during another time period. The transmission of different types of information or traffic often exists, for example, in cellular telephone systems. In general, these different types of traffic signals are usually coded with error-correction codes whose performance is tailored to the degree of error protection required by a particular type of information. For example, digitized speech may be transmitted using a code that provides 2:1 redundancy of the transmitted bits, while digital data information may require a code providing 4:1 redundancy. This difference in redundancy is based on the relative seriousness of uncorrected errors in a particular type of traffic signal. In this example, because a speech signal can still be interpreted by the human listener despite some transmission errors, a lower redundancy is acceptable. By comparison, digital data tolerates few errors and requires higher redundancy.

In many communications systems such as tactical radio systems, cellular radio telephone systems, or computer data systems provided with the aid of telephone modems, a user may desire to mix alternately data and speech. To accomplish this information mixture, a control voice/data switching signal of some sort is transmitted from the transmitter to the receiver to indicate the type of traffic signals to be expected. That signal, often termed a "voice/data flag", must be interpreted with a high degree of certainty so that digital speech is not passed erroneously to a device expecting digital data. Of course, such errors could cause disruption to the data device as well as loss of a portion of the speech. Data that is interpreted incorrectly as speech could cause unpleasant noises in voice conversations as well as a loss of the intended data. To insure the voice/data switching signal is accurately received, communications systems include with the switching signal a high degree of redundancy. The resulting overhead reduces the communications system capacity.

Accordingly, it would be desirable to have a reliable means to distinguish between, for example, coded speech and data signals, without the overhead of an explicit voice/data switching signal.

SUMMARY OF THE INVENTION

A decoding system discriminates between different types of communications traffic signals. Each type of traffic signal is encoded using a different error correction code. Plural, parallel decoders each decode a received traffic signal using a different decoding technique. Each decoding technique operates in accordance with one of the error correction codes. A quantitative measurement of the reliability of a decoded result is generated by each decoder. A comparison processor accumulates the quantitative measurements made by each decoder and compares the accumulated values. That decoder having the most reliable, accumulated value is selected to decode the current traffic signals. The remaining decoders are deactivated to conserve processing time.

The present invention eliminates the need for a voice/data switching signal when handling different types of traffic signals. In addition, the present invention intrinsically selects in a very short time the decoder which most accurately decodes the current traffic signal.

BRIEF DESCRIPTION OF THE DRAWINGS

The present invention will now be described in more detail with reference to preferred embodiments of the invention, given by way of example, and illustrated in the accompanying drawings, in which.

DETAILED DESCRIPTION OF THE PREFERRED EMBODIMENTS

Figure 1:
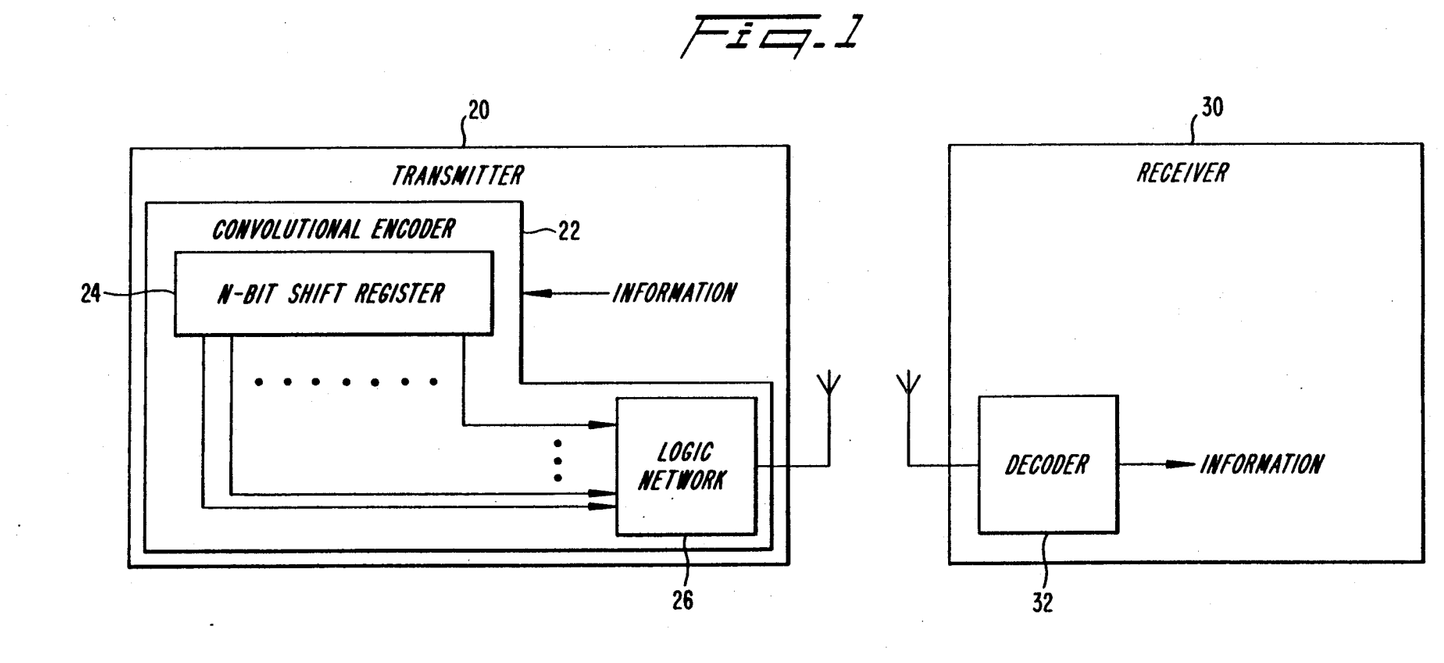
FIG. 1 illustrates a communications system incorporating a convolutional encoder which may be used in the present invention.

The present invention relates to a type of error correction coding known as convolutional coding. Illustrated in FIG. 1 is a transmitter 20 having a convolutional encoder 22 consisting of a shift register 24 or short delay line through which bit sequences of digital information to be coded are shifted. The shift register 24 holds a limited number of symbols n, that number being defined as the constraint length of the code. At any instant in time, the bits in the shift register, which are labelled B1,B2,B3,B4 ... Bn, are processed in a combinatorial logic network 26 to generate two or more different Boolean combinations of the bits. These combinations, generally called parity bits and designated P1,P2 ... Pm, are transmitted over a communications channel to a receiver 30. A decoder 32 decodes the received parity bits back into the original information bits.

If on every shift of the data bits through the shift register 24, two parity bits are calculated, the code is known as a rate ½ code with twice as many parity bits as original data bits being transmitted. If 3 parity bits are generated on every shift, the code is a rate ⅓ code, etc. For example, the equations for the parity bits of a rate ½, constraint length 5 code might be:

$$P1 = B1 + B2 + B3 + B5$$

$$P2 = B1 + B4 + B5$$

where "+" defines modulo-2 addition, i.e., an exclusive-OR operation.

Using a rate 1/n code, n times more output bits are produced than input bits providing an n times redundancy to prevent errors. However, it is not always necessary to transmit all of the calculated parity bits. If some procedure has been established between the transmitter 20 and the receiver 30 to omit certain parity bits from the transmission, the code is a punctured, convolutional code. Punctured codes typically result in awkward coding rates m/n, such as 13/29, where adaption to a transmission rate that is n/m times the data source bit rate is required. Tables of parity equations for various constraint lengths and code rates that result in optimum codes are published in the technical literature, see for example, "Error-Correction Coding for Digital Communications," Clark and Cain, Plenum press, 1981.

The principal methods for decoding convolutional codes are threshold decoding, Sequential Maximum Likelihood Sequence Estimation (SMLSE), and the stack algorithm. A description of SMLSE as well as other decoding methods, such as majority vote, may be found in the "Clarke and Cain" reference noted above. Of the known decoding methods, the Sequential Maximum Length Sequence Estimation method provides theoretically optimum performance. Other methods tend to be a compromise between performance and complexity, especially for long constraint length codes. Thus, while the present invention may be applied to any decoding method, such as the majority vote method, an implementation of a preferred embodiment of the present invention will be described in the context of the SMLSE method. However, this implementation is for purposes of description only.

In a SMLSE decoder which may be used to implement the present invention, a number of electronic storage elements are arranged in groups called states, the number of states being $2^{(n-1)}$ where n is the constraint length of the code to be decoded. The storage elements for each state hold two different types of information, a bit-history and a path metric both associated with a state. A path metric may be considered a confidence factor representing the degree of correlation between a postulated bit sequence and an actual bit sequence. To the extent the postulated and actual bit sequences agree, the smaller the path metric and the greater the confidence associated with that postulate. Because the present invention is readily applied to other decoding methods such as majority vote, the term "postulate" refers generally to any hypothetical bit sequences having some probability of being the actual bit sequence of concern. A postulate therefore represent original information bits, parity bits, or other bit codes.

An important element of most decoders is the use of a "copy" of the encoding circuitry or algorithm. The copy could be the same n-bit shift register connected to the same combinatorial logic network used in the transmitter encoder to generate a sequence of parity bits. The parity bit sequences produced by each possible pattern of the n-bit shift register contents may be stored, for example, in a $2^{(n-1)}$ entry look-up table in electronic memory. Various postulates of bits generated by the shift register are encoded using a particular encoding strategy to generate the parity bits corresponding to such bit postulates. In this way, the postulated parity bits can be compared directly to the received parity bit stream.

The n−1 data bits or states represent all but one of the possible contents of the coding shift register. The nth bit represents the next data bit to be decoded as a binary 0 or 1. Both binary values of the next data bit are tested in conjunction with all the possible combinations of other bits represented by the state number. Thus, all possible $2^n$ bit combinations are tested by the decoder, and a running confidence factor, the path metric, is stored evaluating the correlation between the postulate parity bit pattern and the received sequence of parity bits.

Figure 2:
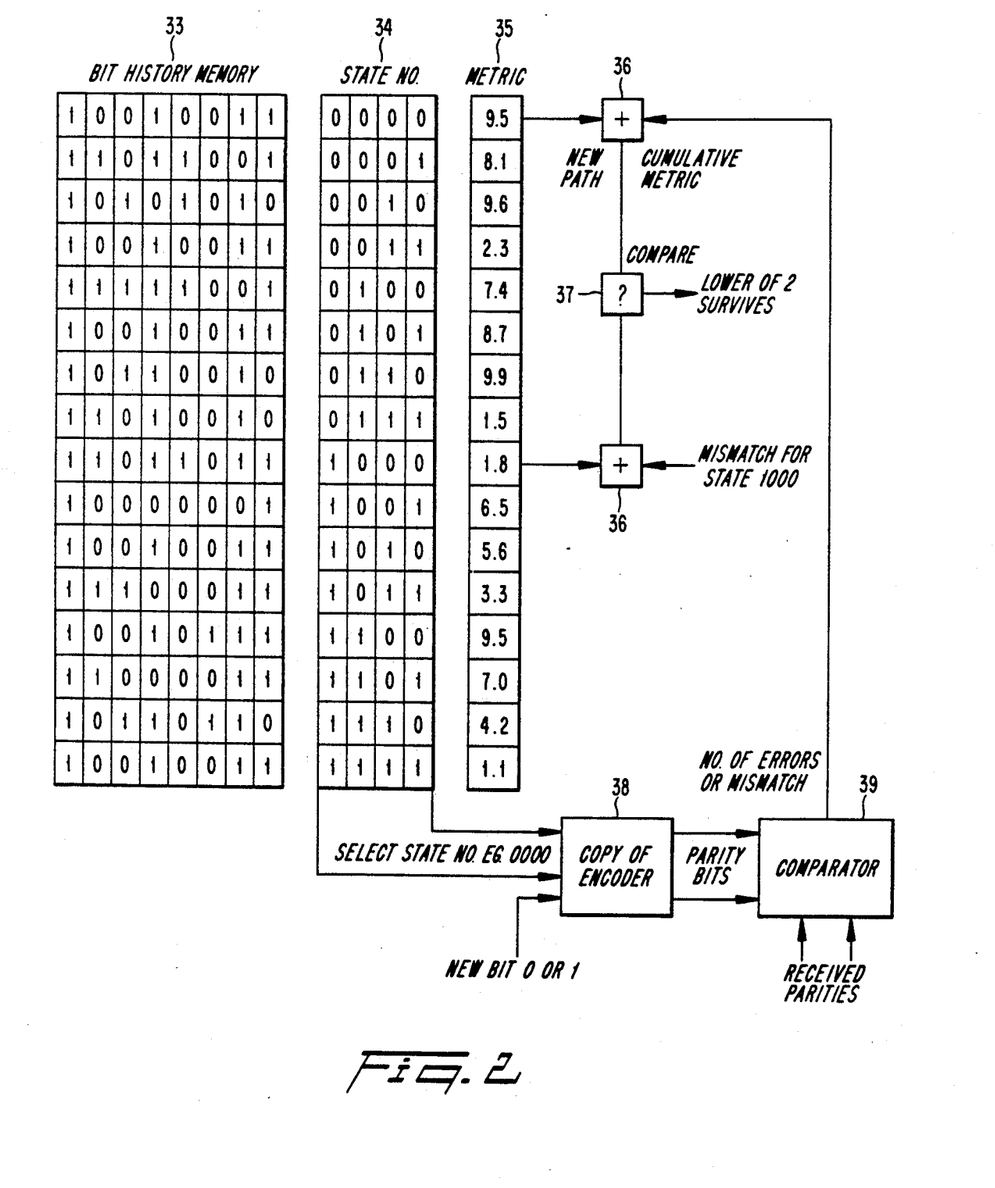
FIG. 2 illustrates an example of a convolutional decoding algorithm which may be used in the present invention.

In conjunction with FIG. 2, an example of the SMLSE algorithm operation will be described assuming a constraint length 5, rate ½ code.

1) For a first state, numbered 0000, it is postulated that the new data bit is a 0. The postulate 00000 of the information bits received is applied to a copy of the convolutional encoder used in the transmitter to generate two parity bits P1(00000) and P2(00000). In other words, the postulate information is encoded using the same parity equations used in the encoder.

2) The actual parity bits received are compared with the postulate parity bits P1 and P2. The comparison results either in a complete match, a single bit match, or no match. If both P1 and P2 match the actual parity bits received, the number 0 is added to the path metric associated with the state 0000. Similarly, if there is only a single match, the number 1 is added to the path metric. If there is no match, the number 2 is added. That metric value represents the cumulative mismatch for the sequence of postulate parity bits that have been tested against that state. The larger the mismatch of parity bits, the larger the metric value.

3) Operations (1) and (2) are now repeated for state 1000. With the nth bit postulated as a new 0, the pattern 10000 is applied to the encoder and its output is compared with the received parity bits. Based on that comparison, the path metric for state 1000 is updated.

4) The updated path metrics for states 0000 and 1000 are now compared, and the state having accumulated the lowest path metric becomes the new state 0000 when the encoder patterns 10000 and 00000 are left shifted and the left most bit shifts into the bit history. After the shift in both cases, 0000 remains. Thus, either of the states 1000 or 0000 can be the predecessor to the next state 0000 in the case where the new bit is a 0. Depending on which state is selected because it has the lowest metric, the left most bit that drops out of the state memory into the right-most bit of the bit history for that state will be a 0 or a 1. Moreover, the other corresponding bits in the bit history memory are copied over from the selected state, overwriting the bits of the state not selected. For example, if the metric for state 10000 is 1.8 and that for state 00000 is 9.5, state 1000 is selected and the bits 10110111 are written into the bit history memory for the new state 0000.

5) Steps (1)-(4) are repeated with the postulate that the new bit is a 1. This results in a new state 0001 which has possible predecessor states 0000 and 1000.

Similarly, steps (1)-(4) are repeated for every pair of predecessors such as 0001 and 1001 (resulting in new states 0010 and 0011), 0010 and 1010 (resulting in new states 0100 and 0101), 0011 and 1011 (resulting in new states 0110 and 0111), etc.

At the end of one of the above iterations, two received parity bits have been processed and one new decoded bit has been shifted into the bit history. Because of the way bit histories overwrite other bit histories when one of a pair of states is selected to survive, the older bits in the bit history memories tend towards agreement. If the oldest bit of the history in every state all agree, that oldest bit is considered a final decision and removed for further processing depending on the application. The algorithm for other rate codes, such as rate ¼, proceeds exactly the same except that four parity bits would be generated by each postulate and compared with four received-bits resulting in possible increments to the cumulative path metrics of 0, 1, 2, 3 or 4 mismatches.

In another variation of the known algorithm, the received parity bits are characterized not just by their bit polarities, but by a magnitude or quality measure representing the degree of "oneness" or "zero-ness." When a mismatch with a locally predicted parity bit is detected, the metric is penalized by a greater amount if the received bit quality is high and there is therefore less doubt that its sign was in fact correct, than if the quality is low and the bit polarity was doubtful. This latter decoding technique ideally uses a "soft" bit quality measure that is proportional to $-LOG(Probability)$ where "probability" is the probability that the bit polarity is correct. When this logarithmic measure is used, the cumulative path metric represents the logarithm of the product of all the bit probabilities. The state and bit history sequence having the smallest cumulative metric represents the sequence having the highest probability of being accurate.

As is known in the art, such convolutional coders and decoders can also be built to work with non-binary symbols such as ternary or quaternary.

The present invention incorporates plural, parallel decoders adapted to decode different types of codes having different rates and constraint lengths. As well as decoding these different types of convolutional codes, the decoder of the present invention determines which type of signal was transmitted without needing an explicit indicator signal, bit pattern, or flag. A speech signal, for example, may be coded using a rate ½, constraint length 5 code, while a data signal would be coded using a rate ¼, constraint length 6 code. Usually, the difference in code types depends on the tolerance a particular type of information has for errors. Speech can be decoded despite a degree of error. Data, on the other hand, cannot. Hence, data typically is encoded using convolutional codes having smaller rates and longer constraint codes.

Figure 3:
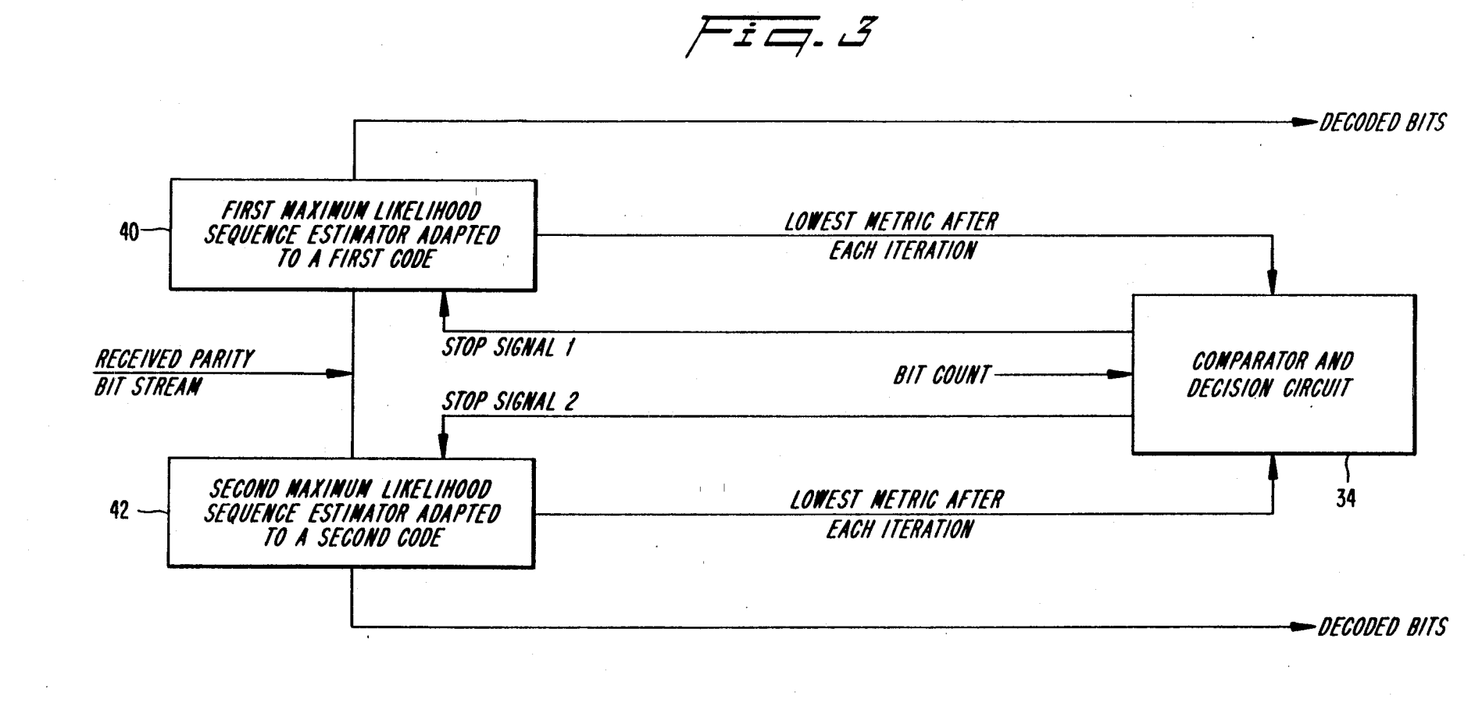
FIG. 3 shows a functional block diagram of the present invention.

A block diagram schematic which may be used to implement the present invention is shown in FIG. 3. A first SMLSE decoder 40 adapted to decode a first convolutional code rate and constraint length receives a bit stream Pi of transmitted parity bits. A second convolutional SMLSE decoder 42 adapted to decode a second code is also fed with that parity bit stream Pi. While two parallel decoders have been shown, any number of parallel decoders may be used depending on the number of different types of traffic signals transmitted using different convolutional codes.

Assuming the decoder 40 operates, for example with rate ¼, four parity bits would be compared with four locally generated parity bit postulates at each iteration. As a result, the parity bits are processed in fours. If the decoder 42 operates at a rate ½, two parity bits are processed at each iteration. In this example, the decoder 40 performs two iterations to each iteration performed by decoder 42 in order to process the same number of parity bits. After each decoder has processed four parity bits, each decoder then determines which state has the lowest cumulative metric and transmits that metric value to the comparator/decision circuit 34. Through a number of iterations, the decision circuit 34 accumulates the optimum metric for each decoder for each iteration. After a sufficient number of iterations have occurred to establish an average or pattern, the decision circuit 34 determines which decoder has the lowest metric value over that number of iterations. Regardless of whether an average value or an absolute value is used, the decision circuit 34 functions to determine that decoder having the optimum reliability and efficiency in decoding the received signals. As another example, if the accumulated, optimum metrics are correct $-LOG(Probability)$ measures of mismatch, the difference between the optimum metrics of the two decoders represents the ratio of the probabilities that each decoder has correctly decoded the signal. When the average value, absolute value, or probability ratio sufficiently favors one decoder, the comparator/decision circuit 34 transmits a stop signal to the other decoder(s) to conserve signal processing resources.

Accordingly, the present invention reduces signal processing time and overhead by eliminating the need for an explicit voice/data switching signal and by terminating the operation of nonselected decoders. Regardless of the specific decoding method used, the present invention provides for a communications system where different types of information transmitted with different respective types of coding may be optimally decoded by parallel decoders. Each decoder decodes the received information using a decoding technique which operates in accordance with one of the different types of coding and provides some quantitative output signal representing the reliability or confidence of the decoded result. In order to generate that decoded result, the various decoding techniques typically utilize a plurality of postulates of the coded signal and/or the original information signal in the process of arriving at the decoded result along with an associated quantitative, reliability factor. The reliability factor for each decoder is accumulated over a period of time and compared against the accumulated reliability factors for all of the other decoders. The decoder having the optimal, accumulated reliability is selected to continue the decoding process. Because the selected decoder is the optimal decoder for decoding the current type of information, the remaining decoders terminate operation.

One significant advantage of the present invention is that the decision about which decoder to continue using can be made reliably after processing only a fraction of the total number of bits in the signal. Moreover, basing the decision on the relative, optimum path metrics of each decoder guarantees that the decoder selection is made only when sufficient decision certainty exists. Depending on the type of convolutional codes and the number of different decoders, the decision criteria may be based simply on the metric difference or on both the metric difference and the absolute metric values. Optimum decision thresholds may be established for the required decision reliability by simulating on a computer the decoder performance with noisy input signals of the type expected in practice.

Figure 4:
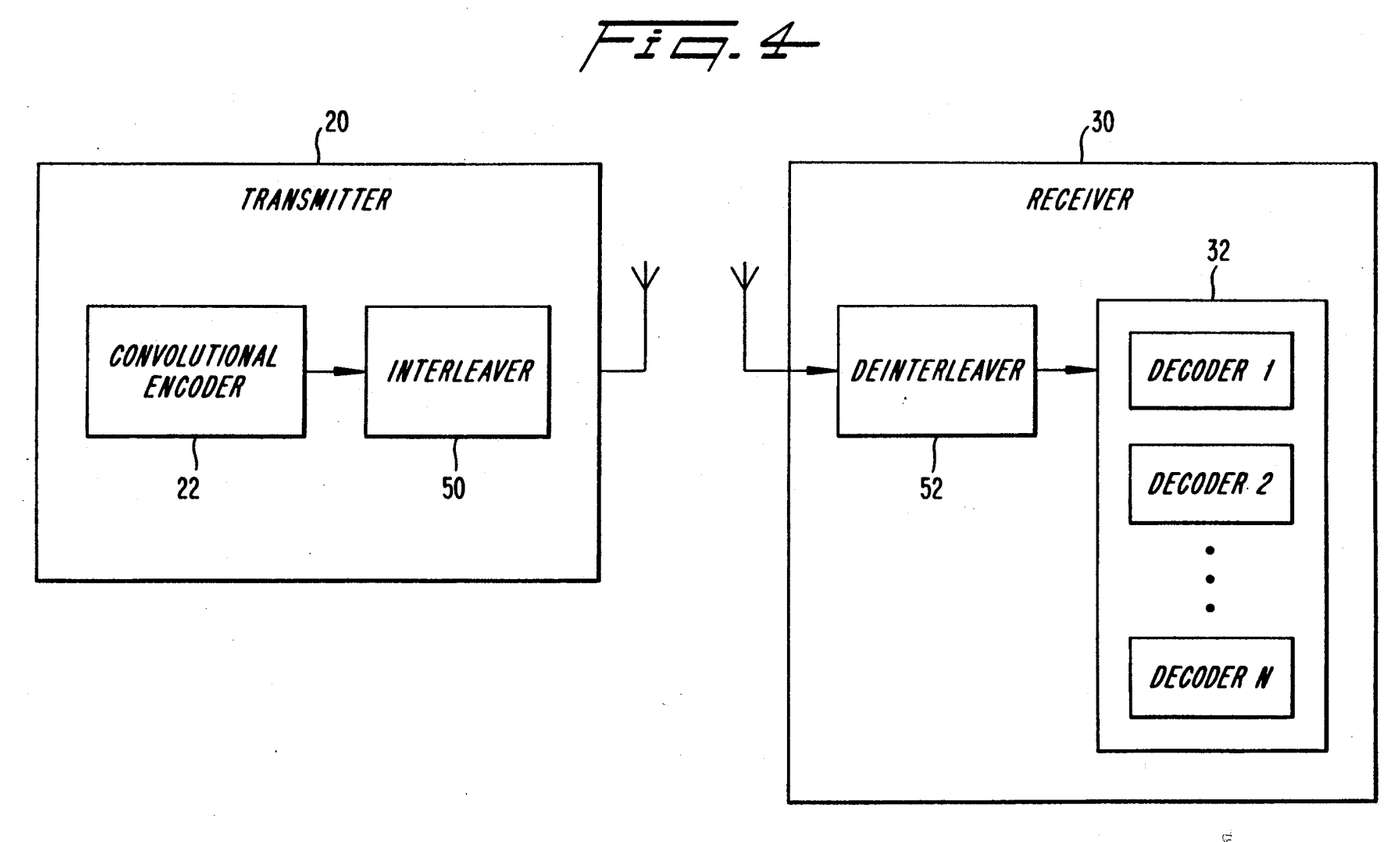
FIG. 4 shows a functional block diagram of a communications system for implementing another embodiment of the present invention.

An error correction coding system for use over communication channels that are exposed to bursts of noise and other errors may be improved by interleaving the transmitted coded bits over an extended period. A transmitter 20 having a conventional interleaver 50 in conjunction with a convolutional encoder 22 is illustrated in FIG. 4. An interleaver 50 receives the encoded bit stream from the convolutional encoder 22 and interleaves the bits in an order which differs from the sequence in which those bits were received. For example, instead of transmitting bits in the order 0,1,2,3,4,5,6,7,8,9, they can be transmitted in the order . . . 2,6,1,5,9,4,8,12,7,11,15 . . . which is 3×3 diagonal interleaving. Upon de-interleaving the bits, if adjacent errors occurred in transmission, the de-interleaving will separate those errors so that their effect on the information is evenly distributed over a large number of bits rather than concentrated in just a few adjacent bits.

In one embodiment of the present invention, the interleaving order for each type of coder is chosen deliberately such that the de-interleaving procedure for determining the order of bits presented to the parallel decoders is identical. As a result, signal processing is minimized.

In another preferred embodiment of the present invention, the interleaving and de-interleaving orders associated with the different convolutional codes are deliberately made different. Different interleaving ensures that there is no correlation between the outputs of two alternative coding processes that could reduce the reliability of discriminating between the output signals. Use of different interleaving is appropriate, for example, when both encoders are of the same rate and/or constraint length.

In situations where one or more of the encoders process different types of traffic by coding only a portion of the bits, the sequentially coded bits received nonetheless occupy the same positions after interleaving under the assumption that all the bits are present. The corresponding de-interleaving pattern produces coded bits in the proper sequential order for presentation to all of the parallel decoders. Despite the presence of uncoded traffic, because of the speed with which the present invention determines the optimum decoder, the selection of a particular decoder is made before encountering uncoded portions of either traffic type.

Figure 5:
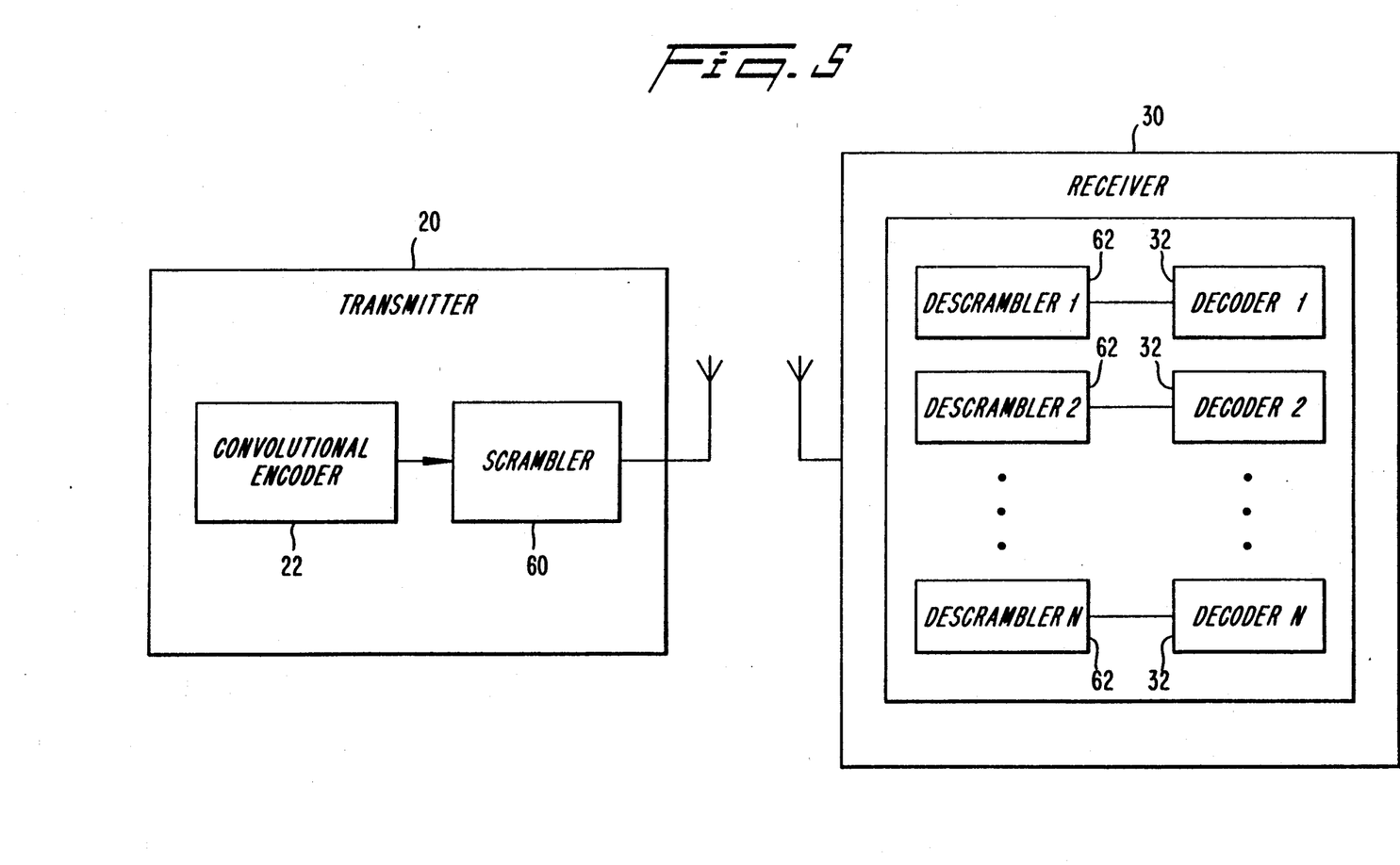
FIG. 5 shows a functional block diagram of a communications system for implementing still another embodiment of the present invention.

A further embodiment of the present invention for providing an alternative procedure to different interleaving orders as a means to ensure low correlation between the outputs of the different coders is illustrated in FIG. 5. A conventional scrambling device 60 receives the output parity bit stream generated by the convolutional encoder 22 of the transmitter 20. The scrambler 60 differently masks the output signals of each encoder 22 by bit-wise, modulo-2 adding to their respective output parity bit streams different scrambling patterns. The scrambling patterns are prearranged between the receiver 30 and transmitter 20 and are removed separately by a conventional descrambler 62 for each of the parallel decoding processes at the decoder inputs. Each receiver 30 includes a number of decoders 32 with each decoder 32 having an associated descrambler 62. Each decoder/descrambler pair is programmed with an associated scrambling pattern for descrambling the received signal. These scrambling patterns are chosen so that descrambling with one pattern associated with a particular signal that has been scrambled with another pattern would yield more or less random digits. As a result, the metric of the associated decoder rapidly increases with the result that the decoder is terminated quickly.

While a particular embodiment of the present invention has been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A communications system providing for discrimination between different types of encoded communications traffic signals, the different types of encoded communications traffic signals being encoded in accordance with respective error correction codes comprising:
    a plurality of decoders for decoding the encoded communications traffic signals, each decoder providing a confidence factor representing a degree of correlation between the encoded communications traffic signals and a respective encoded traffic signal postulate, each decoder including:
        means for comparing an encoded traffic signal postulate with said encoded communications traffic signal, and
        means for generating a confidence factor based on said comparison, and
    selection means for selecting one of said plurality of decoders based on the plurality of confidence factors so that said encoded communications traffic signals are decoded only by said selected decoder.

2. The system according to claim 1, wherein said encoded communications traffic signals are encoded using conventional error correction codes.

3. The system according to claim 1, wherein each decoder uses a sequential maximum likelihood estimation technique to optimally decode said encoded communications traffic signals, each decoder using a rate code and constraint length corresponding to a respective error correction code of a type of encoded communications traffic signal.

4. The system according to claim 3, wherein each decoder includes memory for storing encoded traffic signal postulate bit sequences, a history of selected bits corresponding to each of said encoded traffic signal postulate bit sequences, and a confidence factor corresponding to each of said encoded traffic signal postulate bit sequences.

5. The system according to claim 1, further comprising:
    a transmitter having a convolutional encoder including:
        an N-bit shift register for storing N bits of traffic information;
        a logic circuit, coupled to the N-bit shift register, for logically combining particular ones of said N bits of traffic information in order to generate parity bits; and
        means for transmitting said parity bits to a receiver in the system.

6. The system according to claim 5, wherein the encoded communications traffic signals are encoded using convolutional error correction codes, and each decoder uses a respective convolutional error correction code to decode said encoded communications traffic signals.

7. The system according to claim 1, wherein said encoded communications traffic signals are parity bits.

8. The system according to claim 1, wherein said different types of encoded communications traffic signals include a first type corresponding to voice traffic signals and a second type corresponding to data traffic signals, and wherein said first and second types are encoded with different convolutional codes.

9. The system according to claim 1, wherein each of said decoders optimally decodes a respective one of said different types of encoded communications traffic signals.

10. The system according to claim 1, wherein said selection means includes:
means for accumulating, over a plurality of iterations, said plurality of confidence factors provided by the plurality of decoders, and said selection means selects that decoder having an optimal accumulated confidence factor, the optimal accumulated confidence factor indicating that the respective decoder is most likely to have correctly decoded the encoded communications traffic signals.

11. The system according to claim 1, further comprising:
a transmitter having a convolutional encoder including:
interleaving means for interleaving sequential traffic symbols for each of the different types of encoded communications traffic signals in a non-sequential order, said non-sequential order being used for all of said different types of encoded communications traffic signals, and
a receiver, including said plurality of decoders, for receiving said interleaved traffic symbols, said receiver further including:
de-interleaving means for de-interleaving said interleaved traffic symbols in said non-sequential order.

12. The system according to claim 1, further comprising:
a transmitter having a convolutional encoder including:
interleaving means for interleaving sequential traffic symbols for each of the different types of encoded communications traffic signals in a respective non-sequential order, the respective non-sequential orders being different for different types of traffic signals; and
a receiver, including the plurality of decoders, for receiving said interleaved traffic symbols including:
de-interleaving means for de-interleaving said interleaved traffic symbols in the non-sequential orders corresponding to the different types of encoded communications traffic signals.

13. The system according to claim 1, wherein said selection means terminates operation of nonselected decoders.

14. The system according to claim 1, wherein two of the different types of encoded communications traffic signals are, respectively, encoded speech signals and encoded data signals, and the encoded speech signals are encoded using fewer parity bits than the encoded data signals.

15. The system according to claim 1, wherein said decoders are in parallel.

16. The system according to claim 1, further comprising:
a transmitter including:
a convolutional encoder for encoding different types of communications traffic signals using corresponding different convolutional codes; and
scrambling means for scrambling said different types of encoded communications traffic signals, the scrambling means using a scrambling pattern selected from a plurality of different scrambling patterns, wherein the selected scrambling pattern corresponds to the type of encoded communications traffic signal being scrambled; and
a receiver, including the plurality of decoders, for receiving said scrambled different types of communications traffic signals, the receiver further including:
descrambling means for descrambling said scrambled different types of communications traffic signals using all of said plurality of different scrambling patterns and generating a plurality of descrambled signals and for transmitting said descrambled signals to said plurality of decoders.

17. A communications system providing for discrimination between different types of encoded communications traffic signals, the different types of encoded communications traffic signals being distinguished from one another by their tolerance of errors, comprising:
a plurality of decoders for iteratively decoding the encoded communications traffic signals, each decoder including:
first means for generating a plurality of communications traffic signal postulate bit states;
means for encoding each of said communications traffic signal postulate bit states to generate a respective series of communications traffic signal postulate parity bits;
means for comparing said communications traffic signal postulate parity bits with parity bits of received communications traffic signals;
second means, coupled to the comparing means, for generating an error signal representing a degree of correlation between said communications traffic signal postulate parity bits and the received communications traffic signal parity bits; and
means, coupled to the first and second means, for selecting the communications traffic signal postulate bit state which corresponds to the series of communications traffic signal postulate parity bits for which a lowest error signal was generated and for providing the selected bit state at an output, and
selection means for selecting the decoder which generated the lowest of the lowest error signals, wherein said selected decoder optimally decodes one of the different types of encoded communications traffic signals received.

18. The communications system according to claim 17, wherein said encoding means encodes said communications traffic signal postulate bit states using a convolutional coding procedure used to encode one of the different types of encoded communications traffic signals.

19. The system according to claim 17, further comprising:
a transmitter having a convolutional encoder including:
interleaving means for interleaving sequential traffic symbols for each of the different types of encoded communications traffic signals in a non-sequential order, said non-sequential order being used for all of said different types of encoded communications traffic signals, and
a receiver, including said plurality of decoders, for receiving said interleaved traffic symbols including:

de-interleaving means for de-interleaving said interleaved traffic symbols in said non-sequential order.

20. The system according to claim 17, further comprising:
a transmitter having a convolutional encoder including:
interleaving means for interleaving sequential traffic symbols for each of the different types of encoded communications traffic signals in a respective non-sequential order, the respective non-sequential orders being different for different types of traffic signals; and
a receiver, including the plurality of decoders, for receiving said interleaved traffic symbols including:
de-interleaving means for de-interleaving said interleaved traffic symbols in the non-sequential orders corresponding to the different types of encoded communications traffic signals.

21. The system according to claim 17, wherein said selection means terminates operation of nonselected decoders.

22. The system according to claim 17, further comprising:
a transmitter including:
a convolutional encoder for encoding different types of communications traffic signals using corresponding different convolutional codes; and
scrambling means for scrambling said different types of encoded communications traffic signals, the scrambling means using a scrambling pattern selected from a plurality of different scrambling patterns, wherein the selected scrambling pattern corresponds to the type of encoded communications traffic signal being scrambled; and
a receiver, including the plurality of decoders, for receiving said scrambled different types of communications traffic signals, the receiver further including:
descrambling means for descrambling said scrambled different types of communications traffic signals using all of said plurality of different scrambling patterns and generating a plurality of descrambled signals and for transmitting said descrambled signals to said plurality of decoders.

23. In a communications system of the type in which different types of information are transmitted with different respective types of encoding, the different types of information being distinguished from one another by their respective tolerance of errors, a method for decoding received encoded information, comprising the steps of:
decoding the received encoded information by a decoding technique which operates in accordance with a code used to encode a first type of information, and providing a first quantitative measurement of reliability of a first decoded result;
decoding the received encoded information by a decoding technique which operates in accordance with a code used to encode a second type of information, and providing a second quantitative measurement of reliability of a second decoded result;
comparing the first and second quantitative measurements; and
selecting one of the first and second decoded results based on said comparison.

24. The method of claim 23 further including the steps of:
continuing one of said decoding steps based on said comparison; and
terminating the other decoding step.

* * * * *